(12) United States Patent
Herring et al.

(10) Patent No.: US 11,084,387 B2
(45) Date of Patent: *Aug. 10, 2021

(54) SYSTEMS, METHODS, AND STORAGE MEDIA FOR ARRANGING A PLURALITY OF CELLS IN A VEHICLE BATTERY PACK

(71) Applicant: TOYOTA RESEARCH INSTITUTE, INC., Los Altos, CA (US)

(72) Inventors: Patrick K. Herring, Mountain View, CA (US); Muratahan Aykol, Santa Clara, CA (US); Abraham Anapolsky, San Mateo, CA (US)

(73) Assignee: Toyota Research Institute, Inc., Los Altos, CA (US)

( * ) Notice: Subject to any disclaimer, the term of this patent is extended or adjusted under 35 U.S.C. 154(b) by 240 days.

This patent is subject to a terminal disclaimer.

(21) Appl. No.: 16/284,483

(22) Filed: Feb. 25, 2019

(65) Prior Publication Data

US 2020/0269709 A1  Aug. 27, 2020

(51) Int. Cl.
*B60L 50/60* (2019.01)
*B60L 58/10* (2019.01)
(Continued)

(52) U.S. Cl.
CPC ............... *B60L 50/66* (2019.02); *B60L 58/10* (2019.02); *G01R 31/367* (2019.01);
(Continued)

(58) Field of Classification Search
CPC .. B60L 50/66; B60L 58/10; B60L 3/12; B60L 2240/549; B60L 2240/545;
(Continued)

(56) References Cited

U.S. PATENT DOCUMENTS

| 6,526,361 B1 | 2/2003 | Jones et al. |
| 9,557,387 B2 | 1/2017 | Bulur et al. |

(Continued)

FOREIGN PATENT DOCUMENTS

| CN | 102569922 | 3/2014 |
| CN | 105974327 | 9/2016 |

(Continued)

*Primary Examiner* — Jared Fureman
*Assistant Examiner* — Michael J Warmflash
(74) *Attorney, Agent, or Firm* — Dinsmore & Shohl LLP

(57) ABSTRACT

Systems, methods, and storage media for arranging a plurality of cells in a vehicle battery pack are disclosed. A method includes receiving, by a processing device, data pertaining to cells within a battery pack installed in each vehicle of a fleet of vehicles, the data received from at least one of each vehicle in the fleet and one or more battery testing devices, providing, by the processing device, the data to a machine learning server, directing, by the processing device, the machine learning server to generate a predictive model, the predictive model based on machine learning of the data, estimating, by the processing device, one or more electrical characteristics of each cell to be included in the vehicle battery pack based on the predictive model, and directing, by the processing device, an arrangement of the cells within the battery pack based on the electrical characteristics.

20 Claims, 6 Drawing Sheets

(51) Int. Cl.

| | | |
|---|---|---|
| *G06F 16/28* | (2019.01) | |
| *G01R 31/396* | (2019.01) | |
| *G06N 20/00* | (2019.01) | |
| *G01R 31/367* | (2019.01) | |
| *G06N 5/02* | (2006.01) | |

(52) U.S. Cl.
CPC ......... *G01R 31/396* (2019.01); *G06F 16/285* (2019.01); *G06N 5/02* (2013.01); *G06N 20/00* (2019.01)

(58) Field of Classification Search
CPC .... B60L 2240/547; B60L 58/21; B60L 58/27; G06F 16/285; G01R 31/396; G01R 31/367; G06N 20/00; G06N 5/02
See application file for complete search history.

(56) References Cited

U.S. PATENT DOCUMENTS

| | | | |
|---|---|---|---|
| 9,770,997 B2 | 9/2017 | Lin et al. | |
| 10,176,032 B2* | 1/2019 | Horrell | G05B 23/0275 |
| 10,176,279 B2* | 1/2019 | Nicholas | G06F 9/46 |
| 10,197,631 B2* | 2/2019 | Barfield, Jr. | G07C 5/008 |
| 10,254,751 B2* | 4/2019 | Nicholas | G05B 13/048 |
| 10,306,428 B1* | 5/2019 | Khanna | H04W 4/40 |
| 10,579,750 B2* | 3/2020 | McElhinney | G06F 9/50 |
| 10,684,330 B2* | 6/2020 | Karner | H01M 10/486 |
| 2011/0112781 A1 | 5/2011 | Anderson et al. | |
| 2015/0317589 A1* | 11/2015 | Anderson | G06N 20/00 705/7.25 |
| 2016/0349330 A1* | 12/2016 | Barfield, Jr. | G07C 5/008 |
| 2018/0196107 A1* | 7/2018 | Fleischer | G01R 31/52 |
| 2019/0025820 A1* | 1/2019 | Ferguson | G05D 1/0027 |
| 2019/0118655 A1* | 4/2019 | Grimes | B60L 53/68 |
| 2019/0176639 A1* | 6/2019 | Kumar | B60L 3/0046 |
| 2020/0101976 A1* | 4/2020 | Cella | G07C 5/0816 |
| 2020/0269719 A1* | 8/2020 | Aykol | B60L 58/12 |
| 2020/0269722 A1* | 8/2020 | Aykol | B60L 58/18 |
| 2020/0271725 A1* | 8/2020 | Herring | G01R 31/367 |

FOREIGN PATENT DOCUMENTS

| | | |
|---|---|---|
| CN | 106528951 | 3/2017 |
| CN | 106671785 | 5/2017 |
| CN | 108334900 | 7/2018 |

\* cited by examiner

SYSTEMS, METHODS, AND STORAGE MEDIA FOR ARRANGING A PLURALITY OF CELLS IN A VEHICLE BATTERY PACK

BACKGROUND

Field

The present specification generally relates to vehicle battery pack construction and, more particularly, to systems, methods, and storage media for using machine learning to determine optimal cell arrangement in battery packs and construction of battery packs accordingly.

Technical Background

Battery packs for use in vehicles (e.g., hybrid gas/electric vehicles, electric vehicles, or the like) are generally constructed as a grouping of cells. In some cases, low quality cells (e.g., cells that do not pass a particular inspection) may not be used in battery packs. In addition, the cells within a battery pack may not be arranged so as to maximize the functionality of the battery pack (e.g., maximize performance, maximize life, maximize charge and/or discharge capacity, minimize charging time, avoid damage, or the like).

SUMMARY

One aspect of the present disclosure relates to a method for arranging a plurality of cells in a vehicle battery pack. The method may include receiving, by a processing device, data pertaining to cells within a battery pack installed in each vehicle of a fleet of vehicles. The data received from at least one of each vehicle in the fleet of vehicles and one or more battery testing devices. The method may include providing, by the processing device, the data to a machine learning server. The method may include directing, by the processing device, the machine learning server to generate a predictive model. The predictive model may be based on machine learning of the data. The method may include estimating, by the processing device, one or more electrical characteristics of each of the plurality of cells to be included in the vehicle battery pack based on the predictive model. The method may include directing, by the processing device, an arrangement of the plurality of cells within the battery pack based on the one or more electrical characteristics.

Another aspect of the present disclosure relates to a system configured for arranging a plurality of cells in a vehicle battery pack. The system includes a fleet of vehicles, each vehicle in the fleet of vehicles including a battery pack having a plurality of cells. The system further includes one or more battery testing devices and one or more hardware processors configured by machine-readable instructions. The processor(s) are configured to receive data pertaining to cells installed in each vehicle of the fleet of vehicles. The data is received from at least one of each vehicle in the fleet of vehicles and the one or more battery testing devices. The processor(s) are configured to provide the data to a machine learning server. The processor(s) are configured to direct the machine learning server to generate a predictive model. The predictive model is based on machine learning of the data. The processor(s) are configured to estimate one or more electrical characteristics of each of the plurality of cells to be included in the vehicle battery pack based on the predictive model. The processor(s) are configured to direct an arrangement of the plurality of cells within the battery pack based on the one or more electrical characteristics.

Yet another aspect of the present disclosure relates to a non-transient computer-readable storage medium having instructions embodied thereon, the instructions being executable by one or more processors to perform a method for arranging a plurality of cells in a vehicle battery pack. The method may include receiving, by a processing device, data pertaining to cells installed in each vehicle of a fleet of vehicles. The data received from at least one of each vehicle in the fleet of vehicles and one or more battery testing devices. The method may include providing, by the processing device, the data to a machine learning server. The method may include directing, by the processing device, the machine learning server to generate a predictive model. The predictive model may be based on machine learning of the data. The method may include estimating, by the processing device, one or more electrical characteristics of each of the plurality of cells to be included in the vehicle battery pack based on the predictive model. The method may include directing, by the processing device, an arrangement of the plurality of cells within the battery pack based on the one or more electrical characteristics.

These and other features, and characteristics of the present technology, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of 'a', 'an', and 'the' include plural referents unless the context clearly dictates otherwise.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, wherein like structure is indicated with like reference numerals and in which:

DETAILED DESCRIPTION

Figure 1:
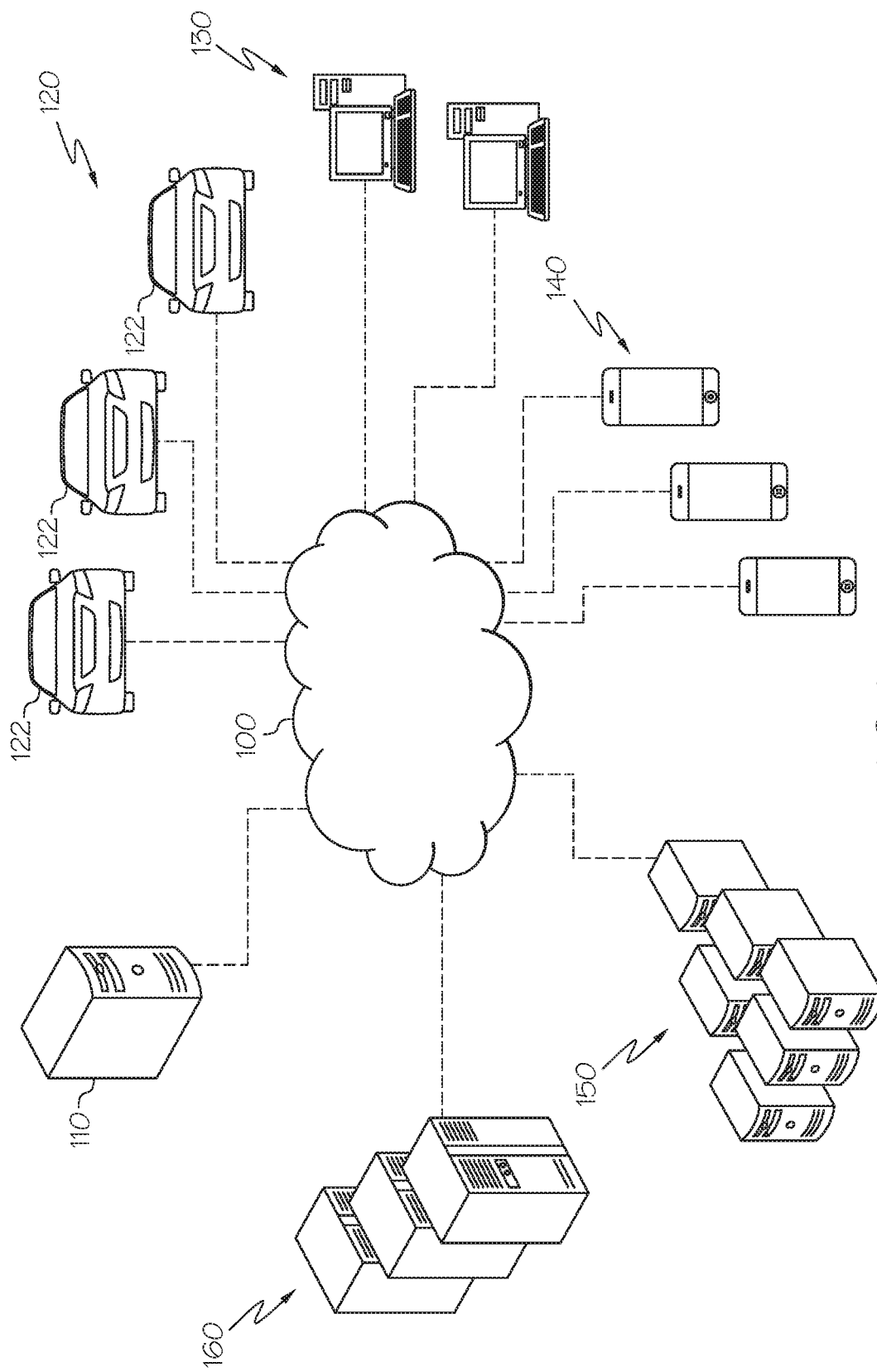
FIG. 1 schematically depicts an illustrative network of devices and systems for arranging a plurality of cells in a battery pack according to one or more embodiments shown and described herein.

The present disclosure relates generally to training and using a machine learning (ML) model to determine an optimum cell arrangement in a battery pack, particularly a battery pack found in vehicles such as electric vehicles (EVs), hybrid gas-electric vehicles, and the like. Training and use of a machine learning model generally includes obtaining data pertaining to the cells in battery packs installed in a fleet of currently-operating vehicles. That is, the data used for training is obtained from evaluation of battery packs used in real-world scenarios. The data is then fed into a ML server, which generates a predictive model that can be used to estimate the electrical characteristics of cells, which in turn can be used to categorize cells and particularly arrange cells when constructing new battery packs.

Battery packs, particularly those used in vehicles such as EVs and hybrid gas-electric vehicles, consist of an arrangement of cells that contain stored energy. The cells are connected in parallel to form a module, and a plurality of modules are connected in series to form a pack. In some cases, the cells are merely arranged within the modules/the battery pack in a manner to maximize the number of cells. That is, the cells are not arranged in any particular manner to ensure optimal operation of the battery pack, such as, for example, to maximize battery pack life, to minimize the charging time necessary to charge the battery pack, to maximize the length of time between charges (e.g., maximize discharge capacity), to maximize charge capacity, to maximize performance of the vehicle or other device using the energy stored in the battery pack, to avoid battery pack failure, and/or the like. In addition, when a battery pack is assembled, the cells that are selected for the battery pack are generally tested to ensure they perform above a particular threshold (e.g., output a particular voltage, discharge at a particular rate, and/or the like). Cells that perform above the threshold may be considered high-quality cells and cells that do not perform above the threshold may be considered low-quality cells. In some cases, low-quality cells may be discarded and not used in battery packs. In other cases, low-quality cells may only be designated for lower performing battery packs (e.g., a standard battery pack on a vehicle, as opposed to an upgraded battery pack or a battery pack that is only available in premium vehicles). In either case, the overall cost of assembling the battery pack is increased because relatively higher quality cells generally cost more to source than relatively lower quality cells.

Another issue with cell arrangements in the battery packs is that certain cells (including high-quality cells), when placed next to each other or otherwise arranged in a particular manner, may operate sub-optimally. For example, various cells may release various levels of thermal energy (e.g., give off heat) during operation (including charging and discharging) due to the inherent impedance properties of the cells. When two cells that give off a relatively high amount of heat are placed next to each other (relative to two cells that give off a relatively lower amount of heat), the amount of heat that is released may be high enough to damage the cells and/or surrounding components of the battery pack, which can result in, for example, battery pack failure, reduced lifetime of the battery pack, quicker discharge times, slower charge times, and/or the like. Accordingly, it becomes necessary to space cells exhibiting high resistance apart from one another to maintain an overall temperature of the modules and the pack in general to avoid heat related issues. In another example, it may be preferable to avoid placing a cells having a relative higher capacity adjacent one another in a module or in a pack so as to avoid stressing the relative lower capacity cells also present in the module or in the pack. Accordingly, it becomes necessary to space the relative higher capacity cells apart from one another to avoid stress on the relative lower capacity cells.

Some systems and methods merely monitor battery pack operation at a pack level (e.g., the battery pack as a whole). Monitoring in this manner is not sufficiently granular to obtain the data that is necessary for machine learning and generation of a model that can be used for configuring cells and modules within a pack.

Referring now to the drawings, FIG. 1 depicts an illustrative network, generally designated 100, of devices and systems for arranging a plurality of cells in a battery pack according to embodiments shown and described herein. As illustrated in FIG. 1, the network 100 may include a wide area network, such as the internet, a local area network (LAN), a mobile communications network, a public service telephone network (PSTN) and/or other network and may be configured to electronically connect a battery configuration system 110, one or more vehicles 122 in a fleet of vehicles 120, one or more user computing devices 130, one or more mobile devices 140, one or more machine learning servers 150, and/or one or more battery testing devices 160.

The battery configuration system 110 is generally a computing device that carries out various processes for determining an arrangement of cells in a battery pack (including a module thereof) and directs placement of the cells accordingly, as described in greater detail herein. The battery configuration system 110 contains one or more hardware components, as will be discussed herein with respect to FIGS. 3A and 3B.

Still referring to FIG. 1, the fleet of vehicles 120 includes one or more vehicles 122, each of which has at least one battery pack therein. For example, each vehicle 122 in the fleet of vehicles 120 may be an electric vehicle, a gas-electric hybrid vehicle, or the like. Each vehicle 122 in the fleet of vehicles 120 can be communicatively coupled to any of the components within the network 100 to transmit data corresponding to the battery pack, and can further receive instructions for utilizing the battery pack therein, as described in greater detail herein. Accordingly, each vehicle 122 in the fleet of vehicles 120 includes one or more hardware components that are used for generating data, communicating data, receiving commands, and executing commands, as described herein with respect to FIG. 4.

Still referring to FIG. 1, the one or more user computing devices 130 and the one or more mobile devices 140 may generally be devices that are used by a user to transmit information from at least one vehicle 122 in the fleet of vehicles 120 (if the vehicle within the fleet of vehicle is not directly coupled to the network 100) and/or receive information from the battery configuration system 110 (e.g., directions) that is used to arrange the cells within a battery pack (or a module thereof) during manufacture of the battery pack. For example, the one or more user computing devices 130 and/or the one or more mobile devices 140 may be communicatively coupled to a vehicle 122 from the fleet of vehicles 120 to receive data from the vehicle (e.g., via the vehicle's on-board diagnostics (OBD) port) and transmit the data via the network 100 to another device (e.g., the battery configuration system 110). In another example, the one or more user computing devices 130 and/or the one or more mobile devices 140 may be integrated with an electric vehicle charging station such that, when the vehicle 122 is connected to the charging station for a charge, a data connection is created between the vehicle 122 and the charging station (e.g., at least one of the user computing device 130 and the mobile device 140) such that data can be transmitted to one or more other components connected to the network 100 via the charging station. In yet another example, the one or more user computing devices 130 and/or the one or more mobile devices 140 may be located in a vehicle repair facility, vehicle dealership, and/or the like. In yet another example, the one or more user computing devices 130 and/or the one or more mobile devices 140 may be located in a battery manufacturing facility, and may receive instructions that are either displayed to a person assembling a battery pack or provided to a robot assembling a battery pack. The instructions may direct the user or the robot to pick certain cells exhibiting characteristics, place the cells in a particular location or in a particular relation to other cells or other battery components (e.g., sensors, cooling devices, or the like), bend the cells in a particular manner, and/or the like. Each of the one or more user computing devices 130 may generally be any computing device that includes components that allow the device to perform any user-facing functions (e.g., a display, a user input device, memory, processing device, communications ports, and/or the like), and is otherwise not limited by the present disclosure. Similarly, each of the one or more mobile devices 140 may generally be any computing device that includes components that allow the device to perform any user-facing functions (e.g., a display, a user input device, memory, processing device, communications ports, and/or the like), and is otherwise not limited by the present disclosure.

The one or more machine learning servers 150 are generally computing devices that store one or more machine learning algorithms thereon and are particularly configured to receive data pertaining to the cells in batteries and generate a model therefrom, the model being useable by the battery configuration system 110 to estimate electrical characteristics of cells, determine an arrangement of cells based on the electrical characteristics, and direct an arrangement of cells within a battery (or a module thereof) accordingly, as described in greater detail herein. The machine learning algorithms utilized by the one or more machine learning servers 150 are not limited by the present disclosure, and may generally be any algorithm now known or later developed, particularly those that are specifically adapted for generating a predictive model that can be used for estimating electrical characteristics of cells. That is, the machine learning algorithms may be supervised learning algorithms, unsupervised learning algorithms, semi-supervised learning algorithms, and reinforcement learning algorithms. Specific examples of machine learning algorithms may include, but are not limited to, nearest neighbor algorithms, naïve Bayes algorithms, decision tree algorithms, linear regression algorithms, supervised vector machines, neural networks, clustering algorithms, association rule learning algorithms, Q-learning algorithms, temporal difference algorithms, and deep adversarial networks. Other specific examples of machine learning algorithms used by the one or more machine learning servers 150 should generally be understood and are included within the scope of the present disclosure.

The one or more battery testing devices 160 are generally devices that are used to test batteries, generate data corresponding to the battery testing, and supply the data to one or more components communicatively coupled thereto via the network 100 (e.g., the battery configuration system 110). The battery testing devices 160 may generally test batteries or components thereof (e.g., modules, cells, or the like) that are not installed in vehicles (i.e., not contained within one of the vehicles 122). The battery testing devices 160 may test a battery or component thereof for charge, voltage, discharge rate, charging time, life span, physical characteristics, chemical composition, cranking amps, internal battery management systems functionality, and/or the like. The battery testing devices 160 may also simulate various discharge conditions. For example, the battery testing devices 160 may complete an EV Drive Cycle Simulation (e.g., Federal Urban Drive Schedule—FUDS), a Hybrid Pulse Power Characterization (HPPC) test, and/or the like. In embodiments with respect to testing of individual cells, the battery testing devices 160 may be used for electrochemistry, battery, and supercapacitor testing, HPCE measurements, electrochemical research and development, half-cell testing, life cycle testing, electrochemical impedance spectroscopy (EIS), and/or the like. In some embodiments, at least one of the battery testing devices 160 may be a high-throughput (HT) cycler. An illustrative example of one of the battery testing devices 160 is the 9220 Dual Bay Series Low Voltage/High Current Cycler available from NH Research (Irvine, Calif.). Another illustrative example of one of the battery testing devices 160 is the various battery testing products available from Arbin Instruments (College Station, Tex.), such as, for example, the Regenerative Battery Testing (RBT) series of devices.

It should be understood that while the user computing device 130 is depicted in FIG. 1 as a personal computer and the battery configuration system 110 and the one or more machine learning servers 150 are depicted as servers, these are nonlimiting examples. More specifically, in some embodiments any type of computing device (e.g., mobile computing device, personal computer, server, etc.) may be utilized for any of these components. Additionally, while each of these computing devices is illustrated in FIG. 1 as a single piece of hardware, this is also merely an example. More specifically, each of the battery configuration system 110, the one or more user computing devices 130, the one or more mobile devices 140, and/or the one or more machine learning servers 150 may represent a plurality of computers, servers, databases, or the like.

Figure 2:
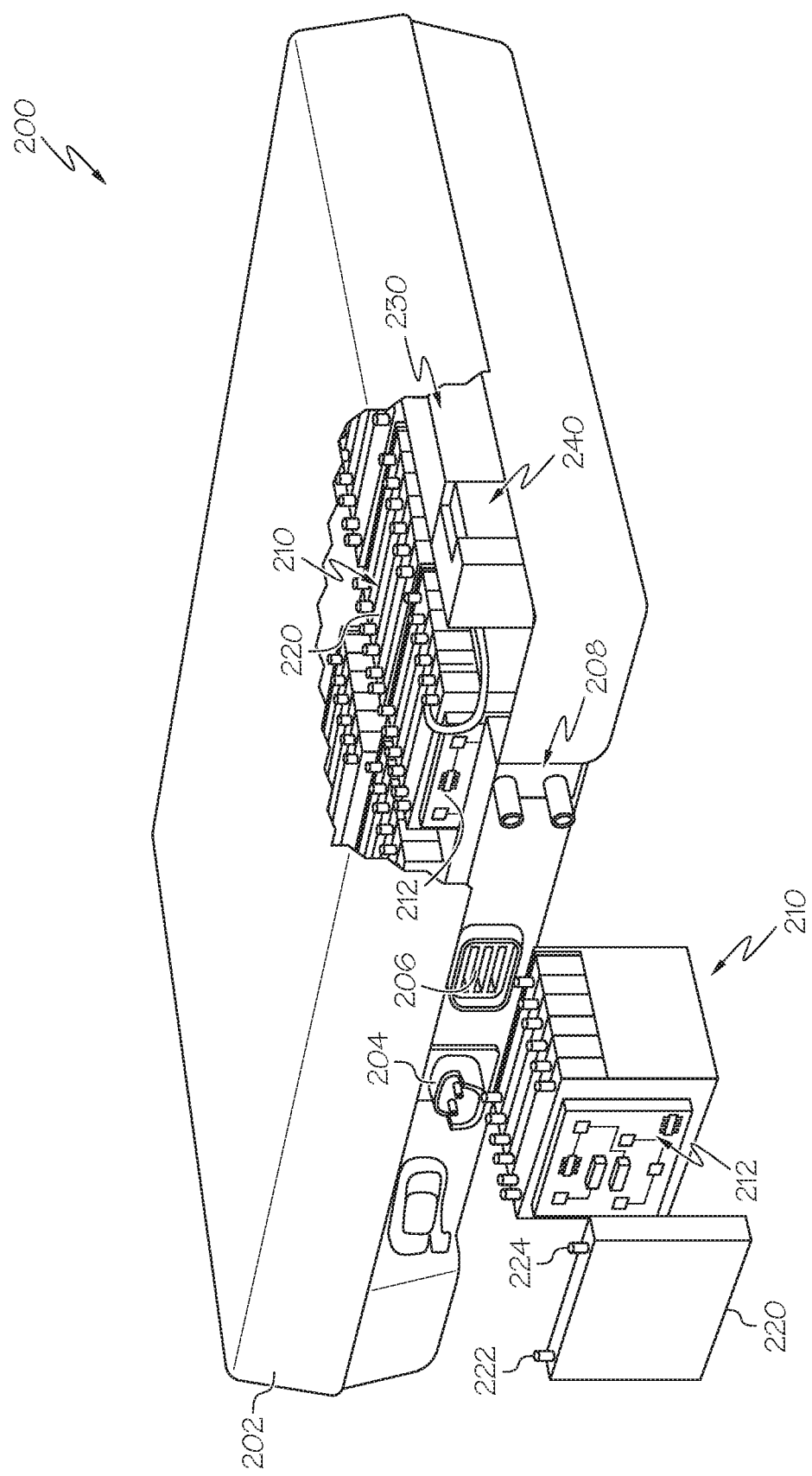
FIG. 2 schematically depicts a perspective view of an illustrative cell, an illustrative module, and an illustrative battery pack having a plurality of cells arranged within a plurality of modules according to one or more embodiments shown and described herein.

FIG. 2 depicts a perspective view of an battery pack 200 containing a plurality of cells 220 arranged within modules 210 therein. FIG. 2 further depicts an illustrative cell 220 and a module 210 that includes a plurality of cells 220 therein. The battery pack 200 depicted in FIG. 2 is an illustrative example of a pack that may be found in a vehicle, such as a vehicle 122 in the fleet of vehicles 120 (FIG. 1). That is, the battery pack 200 may be an energy storage device that is used to power various vehicle components in a vehicle, particularly electric vehicle components, gas-electric hybrid vehicle components, and/or the like. The battery pack 200 depicted in FIG. 2 may also be an illustrative example of a pack that is tested by the one or more battery testing devices 160 (FIG. 1).

Still referring to FIG. 2, in some embodiments, the battery pack 200 may be shaped and/or sized to correspond to a vehicle in which it is installed, and may be configured to house a plurality of the cells 220 and/or the modules 210 therein. The battery pack 200 may include a cover that defines an interior in which the cells 220 and/or modules 210 are contained, along with various other components such as (but not limited to) pack sensor hardware 230 having one or more sensors and/or one or more battery management system (BMS) hardware components 240.

Each of the cells 220 within a module 210 of the battery pack 200 may generally be a battery cell that is used for storing electrical energy that is provided to an external component, such as a component of a vehicle. As such, each of the cells 220 may have a plurality of terminals thereon, including a positive terminal 222 and a negative terminal 224. The cell 220 is otherwise not limited by the present disclosure, and may be any type of battery cell now known or later developed. Illustrative examples of cells include, but are not limited to, lead acid cells, nickel metal hydride (NiMH) cells, lithium ion (Li-ion) cells, and/or the like.

Each of the cells 220 may be any size and/or shape and/or moldable into any size or shape. As such, the present disclosure is not limited to any particular size and shape. Moreover, the modules 210 within the battery pack 200 may have a plurality of cells 220 that have different sizes and shapes. That is, a module 210 may include one or more first cells 220 having a first size and/or shape and one or more second cells 220 having a second size and/or shape that is different from the first size and/or shape. Use of differently shaped cells 220 within a module 210 in various arrangements may allow for the module 210 to be configured in various manners. For example, the module 210 may be molded to fit a particular shape based on the location of that module 210 within the battery pack 200 (e.g., to fit a particularly shaped void, to fit in between particularly shaped components, and/or the like), and the module 210 may be filled with cells 220 having various sizes so as to maximize the number of cells 220 located within the module 210, maximize the amount of energy storage capacity of the module 210, and/or the like. In addition, modules 210 may be subsequently molded and filled with particular cells 220 and/or particular arrangement of cells 220 based on a direction received from the battery configuration system 110 (FIG. 1), as described in greater detail herein. Accordingly, it should be understood that the shape and size of the modules 210 and the cells 220 are not limited by the present disclosure.

In some embodiments, each of the modules 210 may also include a module BMS device 212. The module BMS device 212 may generally be a battery management system that is particularly adapted for the module 210 in which it is located to manage electrical output of the module 210 and/or the cells 220 thereof, manage charging of the module 210 and/or the cells 220 thereof, collect data on a charge and/or a discharge of the module 210 and/or the cells 220, transmit collected data, and/or the like.

The pack sensor hardware 230 located within the battery pack 200 may generally sense one or more characteristics of the battery pack 200, the modules 210 therein, the cells 220 therein, and/or one or more other components therein. For example, the pack sensor hardware 230 may include a temperature sensor configured to sense an internal temperature of the battery pack 200 as a whole, or various portions of the battery pack 200 (e.g., to identify "hot spots" within the battery pack 200). That is, temperature sensors may be dispersed throughout the interior of the battery pack 200 to sense the temperature at particular areas within the battery pack 200. In another example, the pack sensor hardware 230 may include an electrical meter configured to sense one or more electrical characteristics of the modules 210 and/or the cells 220 within the battery pack 200, such as, but not limited to, voltage, impedance, and/or the like. In some embodiments, the pack sensor hardware 230 may be integrated with the module BMS device 212 of each of the modules 210 such that sensing on a cell level or a module level can be achieved. In some embodiments, the pack sensor hardware 230 may be integrated with the BMS hardware components 240. The pack sensor hardware 230 may be communicatively coupled to one or more devices to transmit data corresponding to the sensed characteristics such that the data can be utilized as described herein. For example, the pack sensor hardware 230 may be communicatively coupled to the BMS hardware components 240, which provides the data to one or more external components such as, but not limited to, the battery configuration system 110 (FIG. 1).

Still referring to FIG. 2, the BMS hardware components 240 are generally any electronic system components that are configured to manage the modules 210 and the cells 220 of the battery pack 200, including components that are now known or later developed. As such, the BMS hardware components 240 may generally include components that are particularly configured for maintaining operation of the battery pack 200, monitoring a state of the battery pack 200 (as well as the modules 210 and cells 220 therein), calculating secondary data, transmitting calculated data and/or data received from the pack sensor hardware 230, maintaining the operating environment within the battery pack 200, authenticating the battery pack 200, and/or balancing the battery pack 200.

In some embodiments, the BMS hardware components 240, in conjunction with the pack sensor hardware 230, may monitor and/or control various battery operating parameters of the battery pack 200, the modules 210 thereof, and/or the cells 220 thereof. For example, the BMS hardware components 240 may monitor and/or control voltage (e.g., total voltage, voltage of particular modules 210, voltage of particular cells 220, minimum cell voltage, maximum cell voltage, voltage of periodic taps, and/or the like), temperature (e.g., average temperature, coolant intake temperature, coolant output temperature, coolant flow, temperatures of each module 210, temperatures of each cell 220, and/or the like), state of charge (SOC) or depth of discharge (DOD), state of health (SOH), state of power (SOP), (e.g., current in or out of the battery pack 200, the modules 210 thereof, and/or the cells 220 thereof), and/or recharging parameters (e.g., directing recovered energy and/or the like).

In some embodiments, the BMS hardware components 240 may calculate various values, including, but not limited to, maximum charge current as a charge current limit (CCL), maximum discharge current as a discharge current limit (DCL), energy (e.g., kilowatt-hours (kWh)) delivered since last charge or charge cycle, internal impedance of a module 210 and/or a cell 220, open circuit voltage, charge delivered or stored (e.g., Coulomb counter), total energy delivered since first use, total operating time since first use, total number of cycles, and/or the like.

In embodiments, the BMS hardware components 240 may include a central controller that communicates internally within the battery pack 200 with various other hardware, such as for example, hardware associated with a module 210 and/or a cell 220 (e.g., the module BMS device 212) and/or externally with external components, such as, for example, the various components depicted in FIG. 1. Still referring to FIG. 2, the central controller may communicate via a serial connection, a CAN bus, a DC-Bus (e.g., serial over power line), and/or wirelessly.

The BMS hardware components 240 may also be used to optimize usage of the battery pack 200 (e.g., charging the battery pack 200, discharging the battery pack, and/or the like) by wasting energy from the most charged modules 210 and/or cells 220 by connecting the modules 210 and/or cells 220 to a load (e.g., via passive regulators or the like), shuffling energy from relatively more charged modules 210 and/or cells 220 to relatively less charged modules 210 and/or cells, reducing charging currents such that relatively higher charged modules 210 and/or cells 220 are not damaged, but relatively lower charged modules 210 and/or cells 220 can still to charge, modular charging, and/or the like.

The topology of the BMS hardware components 240 should generally be understood, and is not limited by the present disclosure. That is, the BMS hardware components 240 may a centralized topology whereby a single controller is coupled to all of the modules 210 and cells 220, a distributed topology whereby a BMS board is installed at each module 210 and/or cell (e.g., the module BMS device 212), or a modular topology whereby the BMS hardware components 240 include a plurality of controllers, each of which handles a subset of the total number of modules 210 and cells 220 within the battery pack 200.

In some embodiments, the battery pack 200 may further include one or more ports for transmitting electricity stored in the cells 220, transmitting data (e.g., from the BMS hardware components 240), and/or the like. For example, as depicted in FIG. 2, the battery pack 200 may include an electrical port 204, a data port 206, and/or an auxiliary port 208.

The electrical port 204 is generally provides an electrical coupling to the various components within the battery pack 200, including, but not limited to, the modules 210 and the cells 220. Thus, the electrical port 204, when electrically coupled to an external device, may allow electrical currents to flow between the battery pack 200 and the external device. As such, the electrical port 204 may be shaped, sized, and arranged to electrically couple to one or more components of a vehicle and/or battery testing device.

The data port 206 generally provides a data connection between the components within the battery pack 200 and one or more external components. That is, data gathered and/or generated by various components within the battery pack 200 (e.g., the BMS hardware components 240, each module BMS device 212, data from the pack sensor hardware 230, and/or the like) may be transmitted out of the battery pack 200 via the data port 206 to external components such as (but not limited to), the various components shown and described with respect to FIG. 1. That is, referring also to FIG. 1, the data may be transmitted to the battery configuration system 110, other components of a vehicle 122 in the fleet of vehicles 120, the one or more user computing devices 130, the one or more mobile devices 140, the one or more machine learning servers 150, and/or the one or more battery testing devices 160 via the data port 206. In some embodiments, the data from the components within the battery pack 200 may be transmitted by one device to another device. For example, the data port 206 may be communicatively coupled to a vehicle's CAN bus (or other similar local interface) such that the data from the components within the battery pack 200 are transmitted via the CAN bus where it is retrieved via a connection between the vehicle's CAN bus and another component (e.g., a user computing device 130 or a mobile device connected to the CAN bus via an access port such as the vehicle's OBD port). The data may then be relayed via the network 100 to yet another component such as the battery configuration system 110. In another example, the data port 206 may be communicatively coupled to one or more of the battery testing devices 160 such that data from the components within the battery pack 200 are transmitted to the one or more battery testing devices 160.

The auxiliary port 208 may generally be any type of port for any type of communication or electrical coupling. In some embodiments, the auxiliary port 208 may be used for a combination of communications and electrical coupling (e.g., serial communication over powerline).

It should now be understood the type of battery pack that is generally used for the purposes described herein. However, it should also be understood that the battery pack described with respect to FIG. 2 is merely illustrative, and other battery packs now known or later developed may also be used without departing from the scope of the present disclosure.

Figure 3A:
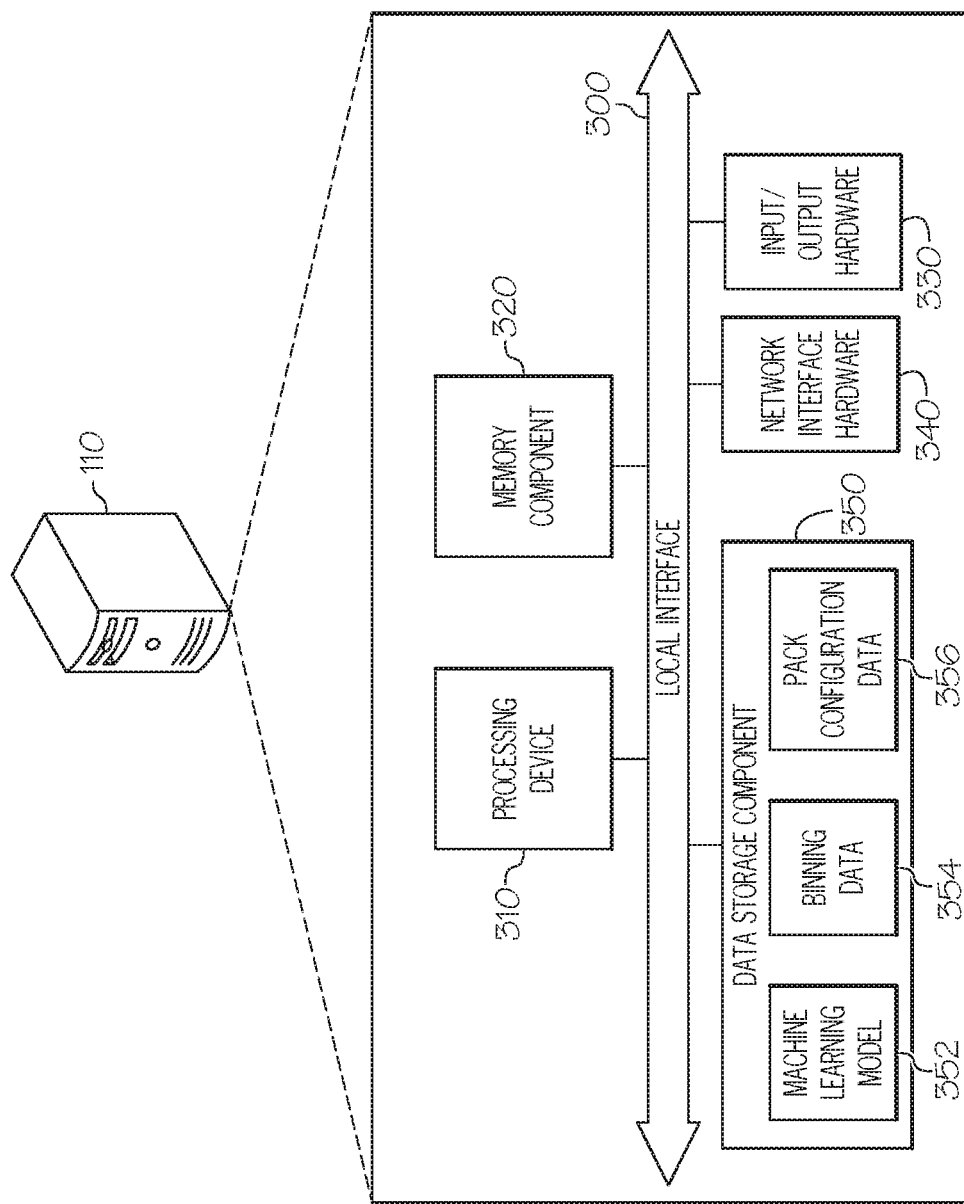
FIG. 3A schematically depicts illustrative hardware components of a battery configuration system that directs an arrangement of cells in a battery pack according to one or more embodiments shown and described herein.

FIG. 3A depicts illustrative internal components of the battery configuration system 110 of FIG. 1 that provide the battery configuration system 110 with the capabilities described herein. As depicted in FIG. 3A, the battery configuration system 110 may include a processing device 310, a non-transitory memory component 320, network interface hardware 340, input/output (I/O) hardware 330, and/or a data storage component 350. A local interface 300, such as a bus or the like, may interconnect the various components.

The processing device 310, such as a computer processing unit (CPU), may be the central processing unit of the battery configuration system 110, performing calculations and logic operations to execute a program. The processing device 310, alone or in conjunction with the other components, is an illustrative processing device, computing device, processor, or combination thereof. The processing device 310 may include any processing component configured to receive and execute instructions (such as from the data storage component 350 and/or the memory component 320).

The memory component 320 may be configured as a volatile and/or a nonvolatile computer-readable medium and, as such, may include random access memory (including SRAM, DRAM, and/or other types of random access memory), read only memory (ROM), flash memory, registers, compact discs (CD), digital versatile discs (DVD), and/or other types of storage components. The memory component 320 may include one or more programming instructions thereon that, when executed by the processing device 310, cause the processing device 310 to complete various processes, such as the processes described herein with respect to FIG. 5.

Figure 3B:
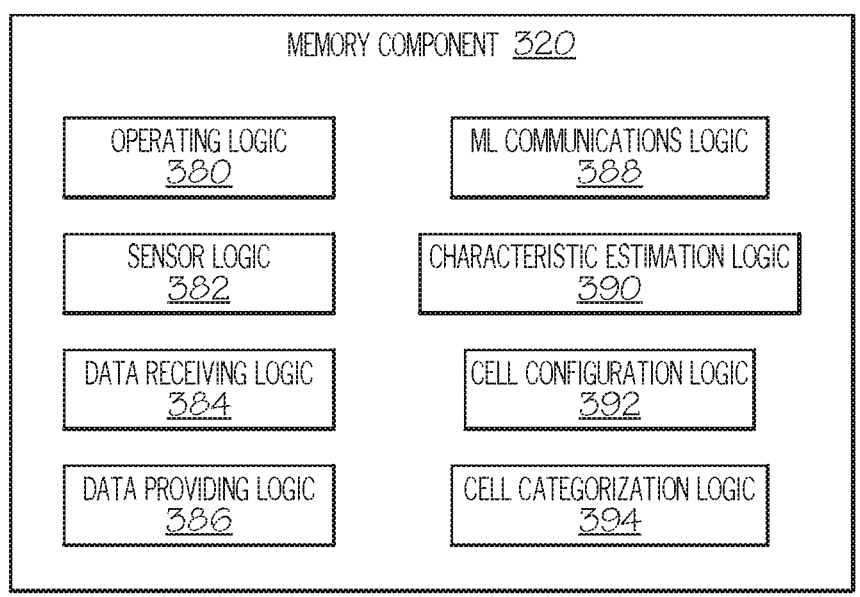
FIG. 3B depicts a block diagram of illustrative logic contained within a memory of a battery configuration system that directs an arrangement of cells in a battery pack according to one or more embodiments shown and described herein.

Referring to FIGS. 3A-3B, the programming instructions stored on the memory component 420 may be embodied as a plurality of software logic modules, where each logic module provides programming instructions for completing one or more tasks. Illustrative logic modules depicted in FIG. 3B include, but are not limited to, operating logic 380, sensor logic 382, data receiving logic 384, data providing logic 386, machine learning communications logic 388, characteristic estimation logic 390, cell configuration logic 392, and/or cell categorization logic 394. Each of the logic modules depicted in FIG. 3B may be embodied as a computer program, firmware, or hardware, as an example.

The operating logic 380 may include an operating system and/or other software for managing components of the battery configuration system 110. The sensor logic 382 may include one or more programming instructions for direction operation of one or more sensors, such as sensors included within a vehicle (e.g., one of the fleet of vehicles 120 (FIG. 1)), sensors included within a battery pack 200 (FIG. 2), and/or the like. Referring to FIGS. 1 and 3B, the data receiving logic 384 may generally include programming instructions for receiving data from one or more components external to the battery configuration system 110, such as, for example, data transmitted by any vehicle 122 from the fleet of vehicles 120, the one or more user computing devices 130, the one or more mobile devices 140, the one or more battery testing devices 160, a battery pack 200 (FIG. 2) and/or the like. Still referring to FIGS. 1 and 3B, the data providing logic 386 may generally include programming instructions for transmitting data to one or more components external to the battery configuration system 110, such as, for example, data to any vehicle 122 from the fleet of vehicles 120, the one or more user computing devices 130, the one or more mobile devices 140, the one or more battery testing devices 160, a battery pack 200 (FIG. 2) and/or the like. Still referring to FIGS. 1 and 3B, the machine learning communications logic 388 may generally include programming instructions for communicating with the one or more machine learning servers 150, such as instructions for transmitting data to the one or more machine learning servers 150, transmitting instructions to the one or more machine learning servers 150, receiving data or information from the one or more machine learning servers 150, directing operation of the one or more machine learning servers 150, and/or the like.

Referring to FIGS. 1, 2 and 3B, the characteristic estimation logic 390 may generally include one or more programming instructions for estimating one or more characteristics of the battery pack 200 and/or components therein based on data received from one or more other components, such as, for example, a vehicle 122 from the fleet of vehicles 120, the one or more machine learning servers 150, and/or the one or more battery testing devices 160. The cell configuration logic 392 may generally include one or more programming instructions for determining a configuration of cells 220 and/or modules 210 within a battery pack 200, as described in greater detail herein. The cell categorization logic 394 may generally include one or more programming instructions for categorizing cells 220 based on one or more characteristics of the cells 220 (e.g., binning the cells 220), as described in greater detail herein.

Referring again to FIG. 3A, the input/output hardware 330 may communicate information between the local interface 300 and one or more other components of the battery configuration system 110 not described herein. In some embodiments, the input/output hardware 330 may be used for one or more user interface components, including local user interface components and/or one or more remote user interface components.

The network interface hardware 340 may include any wired or wireless networking hardware, such as a modem, LAN port, wireless fidelity (Wi-Fi) card, WiMax card, mobile communications hardware, and/or other hardware for communicating with other networks and/or devices. For example, the network interface hardware 340 may be used to facilitate communication between the various other components described herein with respect to FIG. 1.

The data storage component 350, which may generally be a storage medium, may contain one or more data repositories for storing data that is received and/or generated. The data storage component 350 may be any physical storage medium, including, but not limited to, a hard disk drive (HDD), memory, removable storage, and/or the like. While the data storage component 350 is depicted as a local device, it should be understood that the data storage component 350 may be a remote storage device, such as, for example, a server computing device, cloud based storage device, or the like. Illustrative data that may be contained within the data storage component 350 includes, but is not limited to, machine learning model data 352, binning data 354, and/or pack configuration data 356. The machine learning model data 352 may generally pertain to data that is generated by the one or more machine learning servers 150 (FIG. 1) and/or data that is used for the purposes of generating a machine learning model. Still referring to FIG. 3A, the binning data 354 is generally data that is used to assign a classification to each of the cells 220 within a battery pack 200 (FIG. 2), as well as data that is generated as a result of such classification. Still referring to FIG. 3A, the pack configuration data generally contains information pertaining to a particular configuration of a battery pack 200 (FIG. 2) based on information that has been received from the one or more machine learning servers 150 (FIG. 1), data that is generated as a result of operating according to the cell configuration logic 392 and/or the cell categorization logic 394 (FIG. 3B), and/or the like.

It should be understood that the components illustrated in FIGS. 3A-3B are merely illustrative and are not intended to limit the scope of this disclosure. More specifically, while the components in FIGS. 3A-3B are illustrated as residing within the battery configuration system 110, this is a non-limiting example. In some embodiments, one or more of the components may reside external to the battery configuration system 110.

Figure 4:
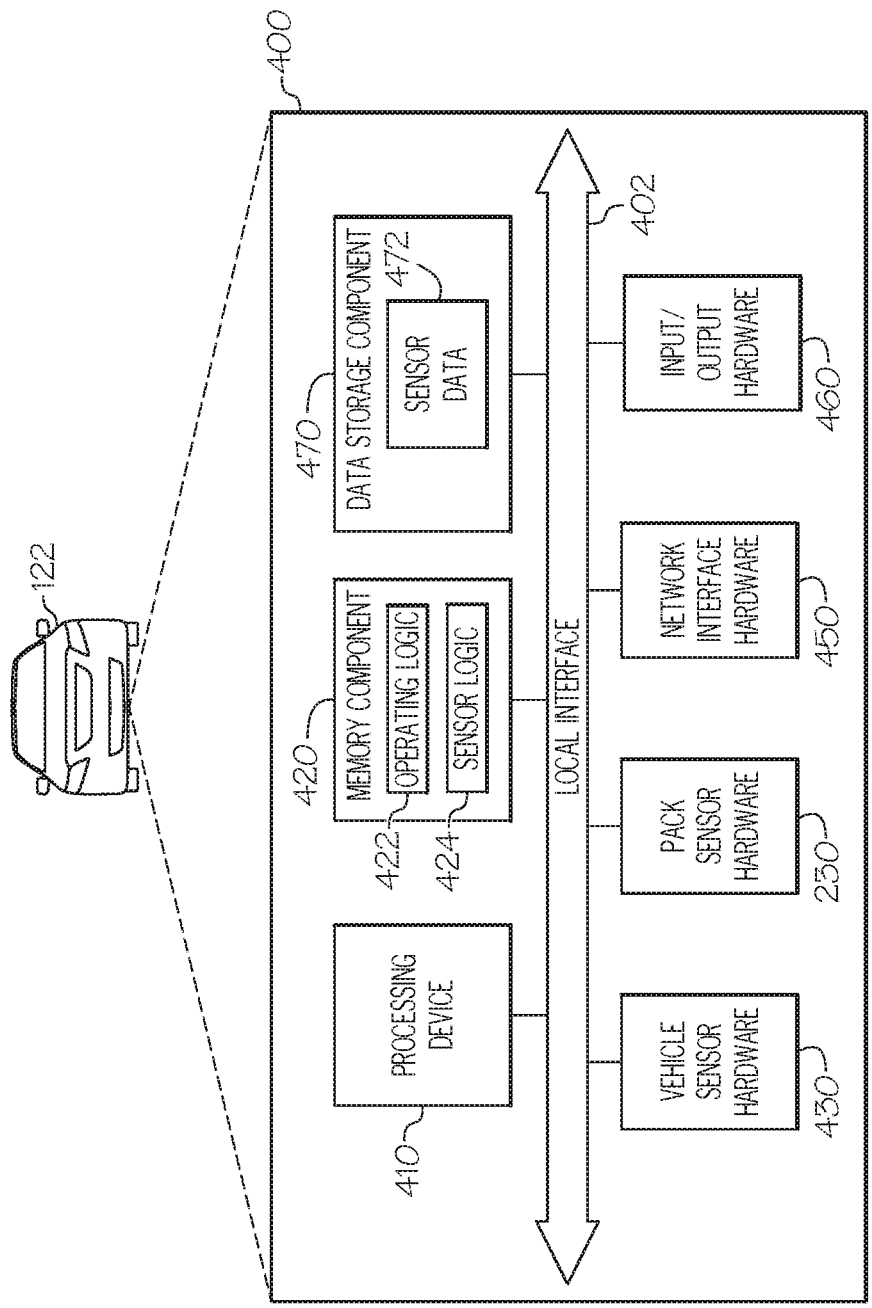
FIG. 4 schematically depicts illustrative hardware components of an illustrative vehicle management module in a vehicle having a battery pack according to one or more embodiments shown and described herein.

FIG. 4 depicts illustrative internal components of a vehicle battery management module 400 within a vehicle 122 in the fleet of vehicles 120 (FIG. 1) according to various embodiments. The vehicle battery management module 400 is generally separate from the BMS hardware components 240 located in the battery pack 200 depicted in FIG. 2, but works in tandem with the BMS hardware components 240 to provide the functionality described herein. As illustrated in FIG. 4, the vehicle battery management module 400 may include a processing device 410, a non-transitory memory component 420, vehicle sensor hardware 430, the pack sensor hardware 230, network interface hardware 450, input/output (I/O) hardware 460, and/or a data storage component 470. A local interface 402, such as a bus or the like (e.g., the vehicle CAN bus), may interconnect the various components.

The processing device 410, such as a computer processing unit (CPU), may be the central processing unit of the vehicle battery management module 400, performing calculations and logic operations to execute a program. The processing device 410, alone or in conjunction with the other components, is an illustrative processing device, computing device, processor, or combination thereof. The processing device 410 may include any processing component configured to receive and execute instructions (such as from the data storage component 470 and/or the memory component 420).

The memory component 420 may be configured as a volatile and/or a nonvolatile computer-readable medium and, as such, may include random access memory (including SRAM, DRAM, and/or other types of random access memory), read only memory (ROM), flash memory, registers, compact discs (CD), digital versatile discs (DVD), and/or other types of storage components. The memory component 420 may include one or more programming instructions thereon that, when executed by the processing device 410, cause the processing device 410 to complete various processes, such as the processes described herein with respect to FIG. 5.

Still referring to FIG. 4, the programming instructions stored on the memory component 420 may be embodied as a plurality of software logic modules, where each logic module provides programming instructions for completing one or more tasks. Illustrative logic modules depicted in FIG. 4 include, but are not limited to, operating logic 422 and/or sensor logic 424. Each of the logic modules shown in FIG. 4 may be embodied as a computer program, firmware, or hardware, as an example. The operating logic 422 may include an operating system and/or other software for managing components of the vehicle battery management module 400. The sensor logic 424 may include one or more programming instructions for directing operation of the vehicle sensor hardware 430 and/or the pack sensor hardware 230, including, but not limited to, directing the vehicle sensor hardware 430 and/or the pack sensor hardware 230 to sense one or more characteristics of the vehicle 122 and/or the battery pack 200 (FIG. 2), transmit data corresponding to the one or more sensed characteristics, and/or the like.

Still referring to FIG. 4, the vehicle sensor hardware 430 may generally include one or more hardware components that sense one or more vehicle characteristics, particularly characteristics that provide information that can be used to determine a functioning of the battery pack 200 (FIG. 2) and/or complete the various processes described herein. Illustrative hardware components include, but are not limited to, a camera (including video and still cameras), an optical sensor, a ranging system, a time-of-flight (TOF) sensor, a proximity sensor, a temperature sensor, global positioning satellite (GPS) components, electrical sensors (e.g., voltage sensors, impedance sensors, and/or the like), accelerometers, gyroscopes, speed sensors, and/or the like. Other sensors, particularly those used for the purposes of obtaining information relating to battery function, vehicle function, terrain on which the vehicle is driving, and/or the like are also included without departing from the scope of the present disclosure. In some embodiments, the vehicle sensor hardware 430 may receive sensed information and transmit signals and/or data corresponding to the sensed information to one or more components described herein. For example, the vehicle sensor hardware 430 may receive acceleration and/or speed information pertaining to the vehicle and generate one or more signals and/or data to transmit to the processing device 410 for processing the data, transmitting the data to other components, and/or the like, as described in greater detail herein.

The network interface hardware 450 may include any wired or wireless networking hardware, such as a modem, LAN port, wireless fidelity (Wi-Fi) card, WiMax card, mobile communications hardware, and/or other hardware for communicating with other networks and/or devices. For example, the network interface hardware 450 may be used to facilitate communication between the various other components described herein with respect to FIG. 1.

Still referring to FIG. 4, the input/output hardware 460 may communicate information between the local interface 402 and one or more other components of the vehicle 122 not described herein. For example, one or more vehicle components located within the vehicle 122 but not part of the vehicle battery management module 400 may communicate with the various components of the vehicle battery management module 400 via the input/output hardware 460. In some embodiments, the vehicle sensor hardware 430 may be located outside the vehicle battery management module 400 and may communicate (e.g., transmit signals and/or data) with the various components of the vehicle battery management module 400 via the input/output hardware 460.

The data storage component 470, which may generally be a storage medium, may contain one or more data repositories for storing data that is received and/or generated. The data storage component 470 may be any physical storage medium, including, but not limited to, a hard disk drive (HDD), memory, removable storage, and/or the like. While the data storage component 470 is depicted as a local device, it should be understood that the data storage component 470 may be a remote storage device, such as, for example, a server computing device, cloud based storage device, or the like. Illustrative data that may be contained within the data storage component 470 includes, but is not limited to, sensor data 472 and/or other data. The sensor data 472 may generally include data that is obtained from the vehicle sensor hardware 430 and/or the pack sensor hardware 230. Nonlimiting examples of data contained within the sensor data 472 may include vehicle operations data (e.g., accelerometer data, gyroscope data, speed data, GPS data, and/or the like), image data pertaining to an environment in which the vehicle 122 is operating, and battery operations data (e.g., temperature data, voltage data, impedance data, and/or the like).

It should be understood that the components illustrated in FIG. 4 are merely illustrative and are not intended to limit the scope of this disclosure. More specifically, while the components in FIG. 4 are illustrated as residing within the vehicle battery management module 400 within the vehicle 122, this is a nonlimiting example. In some embodiments, one or more of the components may reside external to the vehicle battery management module 400 and/or the vehicle 122.

Figure 5:
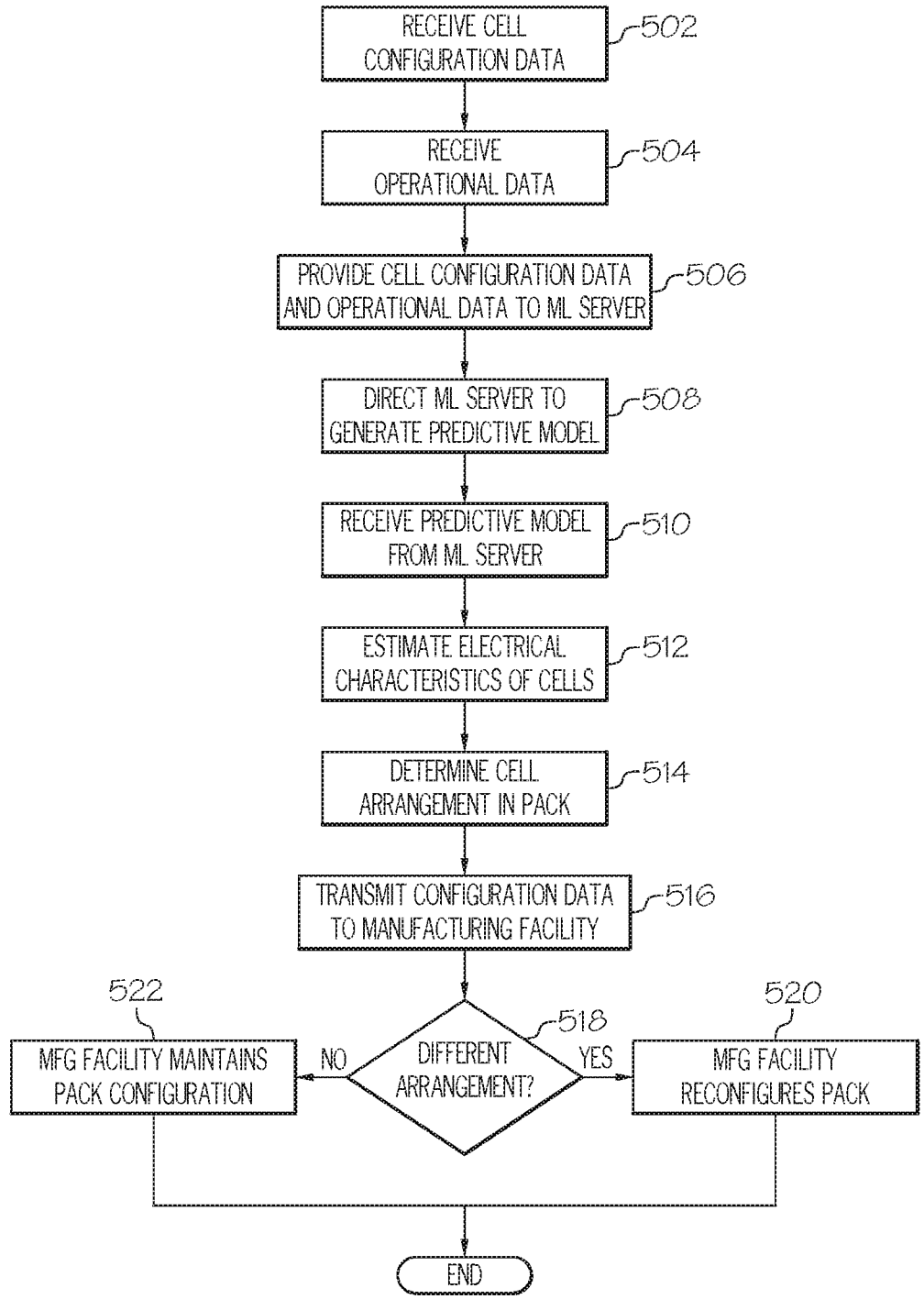
FIG. 5 depicts a flow diagram of an illustrative method of arranging cells in a battery pack according to one or more embodiments shown and described herein.

As mentioned above, the various components described with respect to FIGS. 1-4 may be used to carry out one or more processes and/or provide functionality for arranging cells in a battery pack during battery pack manufacture. An illustrative example of the various processes are described with respect to FIG. 5 hereinbelow. The various processes described with respect to FIG. 5 may generally be completed by one or more of the components depicted in FIGS. 1-4. FIG. 5 depicts an illustrative method of arranging cells in a battery pack according to various embodiments. That is, FIG. 5 generally relates to construction of new battery packs. The various steps described with respect to FIG. 5 are merely illustrative, and additional, fewer, or alternative steps are contemplated without departing from the scope of the present disclosure.

While also generally referring to FIGS. 1-4, at block 502, cell configuration data may be received. That is, the battery configuration system 110 may receive data from the battery pack 200 (e.g., the BMS hardware components 240) that pertains to how the various cells 220 are configured within the modules 210 in the battery pack 200. The cell configuration data generally includes information pertaining to the arrangement of particular cells 220 in a module 210, the arrangement of particular modules 210 in the battery pack 200, the capacity of each cell 220 in a module 210, the capacity of each module 210, the output of each cell 220 in a module 210, the output of each module 210, and/or the like.

The cell configuration data may generally be received directly from the vehicle 122 containing the battery pack 200 (e.g., via a data connection between the vehicle 122 and the battery configuration system 110) and/or from at least one of the one or more user computing devices 130 and the one or more mobile devices 140 (e.g., when the vehicle 122 is connected to a user computing device 130 or a mobile computing device by the OBD port in the vehicle 122). For example, if the vehicle 122 has a constant data connection, data from the battery pack 200 installed therein may be continuously transmitted according to block 502, or may be transmitted at particular intervals (e.g., hourly, daily, weekly, monthly, or the like). In another example, data from the vehicle 122 may be transmitted when the vehicle is in a technician's shop or other location containing a user computing device 130 or a mobile device 140 that obtains the data from the vehicle and relays the data to the battery configuration system 110. In yet another example, in embodiments where the user computing device 130 or the mobile computing device is a charging station, the data may be offloaded from the vehicle 122 to the battery configuration system 110 when the vehicle is connected to the charging station for charging.

At block 504, operational data may be received. That is, the battery configuration system 110 may receive data from the battery pack 200 (e.g., the BMS hardware components 240) that pertains to how the various cells 220 are operating when the battery pack 200 is used (e.g., charged and discharged). As such, the operational data contains data from various sensors (e.g., the pack sensor hardware 230, the module BMS device 212, and/or the like) that are configured to monitor various electrical characteristics of each of the cells 220, the modules 210, and/or the like. For example, the operational data may include voltage information for each of the modules 210 and/or cells 220 within the battery pack 200, impedance information for each of the modules 210 and/or cells 220 within the battery pack 200, operating temperatures within the battery pack 200, including operating temperatures of various modules 210 and/or cells 220, an amount of time necessary to discharge each module 210 and/or cell 220 in particular operating conditions, an amount of time necessary to charge each module 210 and/or cell 220 in particular operating conditions, and/or the like. In some embodiments, the operational data may be obtained from various ones of the vehicle sensor hardware 430 such that operating conditions of the vehicle 122 can be determined. For example, the data received from the vehicle sensor hardware 430 may be indicative of an environmental temperature outside the vehicle 122, the type of terrain the vehicle 122 is traversing, whether the vehicle 122 is in stop-and-go traffic, the gradation of the road the vehicle 122 is traversing, how fast the vehicle 122 drives, how quickly the vehicle 122 accelerates and/or decelerates, and/or the like.

The operational data may generally be received directly from the vehicle 122 containing the battery pack 200 (e.g., via a data connection between the vehicle 122 and the battery configuration system 110) and/or from at least one of the one or more user computing devices 130 and the one or more mobile devices 140 (e.g., when the vehicle 122 is connected to a user computing device 130 or a mobile computing device by the OBD port in the vehicle 122). For example, if the vehicle 122 has a constant data connection, data from the battery pack 200 installed therein may be continuously transmitted according to block 502, or may be transmitted at particular intervals (e.g., hourly, daily, weekly, monthly, or the like). In another example, data from the vehicle 122 may be transmitted when the vehicle is in a technician's shop or other location containing a user computing device 130 or a mobile device 140 that obtains the data from the vehicle and relays the data to the battery configuration system 110. In yet another example, in embodiments where the user computing device 130 or the mobile computing device is a charging station, the data may be offloaded from the vehicle 122 to the battery configuration system 110 when the vehicle is connected to the charging station for charging.

It should be understood that in some embodiments, the cell configuration data received according to block 502 and the operational data received according to block 504 may occur substantially simultaneously. That is, the data stream received by the battery configuration system 110 may include both cell configuration data and operational data in some embodiments.

At block 506, the received data (e.g., the cell configuration data and the operational data) is provided to the one or more machine learning servers 150. That is, the data is transmitted by the battery configuration system 110 to at least one of the machine learning servers 150 via the network. Once the machine learning servers 150 receive the data, the machine learning servers 150 may be directed by the battery configuration system 110 to generate a predictive model at block 508. That is, a signal may be transmitted from the battery configuration system 110 to the one or more machine learning servers 150 (e.g., via the network 100) that causes the machine learning servers 150 to feed the received data (e.g., the cell configuration data and the operational data) into a predictive model and/or generate a predictive model from the data. The predictive model may generally be any machine learning model now known or later developed, particularly one that provides resulting information that can be used to determine optimum battery pack configuration (e.g., an optimum configuration of modules, cells, and/or other components within the battery pack). Illustrative examples of machine learning models include, but are not limited to, a convolutional neural network (CNN) model, a long short-term memory (LSTM) model, a neural network (NN) model, a dynamic time warping (DTW) model, or the like. The developed model may extract features from the data automatically or may give distances between two arbitrary cell profiles directly, and do supervised or unsupervised binning/clustering.

The predictive model may be transmitted to the battery configuration system 110 for further use as described hereinbelow. In some embodiments, the predictive model may be stored in a battery database or the like such that it can be subsequently retrieved for updating, subsequent use by the battery configuration system 110, and/or the like. For example, the predictive model may be stored as part of the machine learning model data 352 within the data storage component 350 of the battery configuration system 110.

At block 510, the battery configuration system 110 may receive the predictive model from the one or more machine learning servers 150 (or retrieve the predictive model from data storage) and may estimate the electrical characteristics of particular cells at block 512. That is, the battery configuration system 110 may determine expected operating characteristics of any cell that is produced based on the predictive model. That is, if a produced cell has particular dimensional characteristics, has a particular configuration, uses a particular chemical composition, is constructed of a particular material, and/or the like, the expected electrical characteristics of that cell can be estimated from the predictive model. That is, an expected voltage output, an expected impedance, and/or the like can be determined. Accordingly, cells that are produced (whether actual or theoretical) can be binned (e.g., categorized) according to the estimated electrical characteristics and/or other characteristics so that they can later be used in an optimal configuring, as described herein. Illustrative examples of binning include, but are not limited to, binning based on one or more of a cell size, a cell impedance, a cell quality, and a cell performance (e.g., an expected performance of the cell under particular operating conditions).

Accordingly, at block 514, cell arrangement in a battery pack (as well as cell arrangement in a module and module arrangement in the battery pack) can be determined based on the estimated electrical characteristics. That is, a battery pack can be arranged in a manner that optimizes the functionality thereof, as described herein. For example, the estimated electrical characteristics of cells can be used to ensure certain cells are always placed adjacent to one another, certain cells are not placed adjacent to one another, and/or certain cells are located closer to or further from particular battery components (e.g., cooling devices, control devices, sensors, BMS components, and/or the like). More specifically, cells having a relatively higher capacity may not be placed next to one another to avoid stressing other, relatively lower capacity cells. In addition, cells that are known to develop a high resistance, thereby generating excess heat, may be arranged within a module or within the battery pack to avoid overheating and/or causing pack failure (e.g., next to cooling devices, next to devices that do not develop a high resistance, and/or the like).

Once the cell arrangement has been determined, the resultant configuration data containing the particular cell arrangement is transmitted to a manufacturing facility at block 516. The manufacturing facility can then bin the cells according to the configuration data and can further determine at block 518 whether the current arrangement of cells within battery packs as constructed are different from the cell arrangement provided in the configuration data. If not, the manufacturing facility maintains the pack configuration at block 522. If so, the manufacturing facility reconfigures the pack at block 520. The process may then end.

In some embodiments, as the newly constructed packs are placed into operation (e.g., into the vehicles 122 in the fleet of vehicles 120, used by the battery testing devices 160), new data may be generated and provided to the battery configuration system 110, such that the steps described herein with respect to FIG. 5 are repeated. That is, the processes according to FIG. 5 may be continuously run to continuously update the model and subsequent determined cell arrangement to continuously optimize battery pack construction.

It should now be understood that the systems and methods described herein conduct training and use of an ML model to determine an optimum cell arrangement in a battery pack. The training and use of a machine learning model generally includes obtaining data pertaining to the cells in battery packs installed in a fleet of currently-operating vehicles and feeding the data into a ML server. The ML server generates a predictive model that can be used to estimate the electrical characteristics of cells, which in turn can be used to particularly arrange cells when constructing new battery packs to ensure that the new battery packs are optimized for use. Furthermore, the systems and methods described herein ensure that all cells are used when constructing a pack, thereby avoiding wastage of cells that may otherwise be deemed low quality or unsuitable for use in particular applications.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A method, comprising:
   receiving data pertaining to cells within a battery pack installed in each vehicle of a fleet of vehicles, the data received from at least one of each vehicle and one or more battery testing devices;
   providing the data to a machine learning server and directing the machine learning server to generate a predictive model based on machine learning of the data;
   estimating one or more electrical characteristics of each of a plurality of cells to be included in the vehicle battery pack during manufacture thereof based on the predictive model; and
   directing an arrangement of the plurality of cells within the battery pack during manufacture based on the electrical characteristics.

2. The method of claim 1, further comprising storing the data and the predictive model in a battery database for subsequent access by the machine learning server.

3. The method of claim 1, further comprising categorizing each of the plurality of cells.

4. The method of claim 3, wherein categorizing each of the plurality of cells comprises binning each of the cells based on one or more of a cell size, a cell impedance, a cell quality, and a cell performance.

5. The method of claim 1, wherein directing the arrangement of the plurality of cells comprises transmitting arrangement instructions to a manufacturing computer.

6. The method of claim 1, wherein the arrangement of the plurality of cells is an optimal arrangement that maximizes a life of the battery pack.

7. The method of claim 1, wherein the arrangement of the plurality of cells is an optimal arrangement that maximizes a performance of the battery pack.

8. The method of claim 1, wherein receiving the data comprises receiving supplemental data from one or more vehicle-specific sensors in each vehicle of the fleet of vehicles.

9. A system configured for arranging a plurality of cells in a vehicle battery pack, the system comprising:
   a fleet of vehicles, each vehicle comprising a battery pack having a plurality of cells;
   one or more battery testing devices; and
   a hardware processor communicatively coupled to each vehicle and to the one or more battery testing devices, the hardware processor configured to:
   receive data pertaining to the plurality of cells in each vehicle from at least one of each vehicle and the one or more battery testing devices;
   provide the data to a machine learning server;
   direct the machine learning server to generate a predictive model based on machine learning of the data;
   estimate one or more electrical characteristics of each of the plurality of cells to be included in the vehicle battery pack during manufacture thereof based on the predictive model; and
   direct an arrangement of the plurality of cells within the battery pack during manufacture based on the one or more electrical characteristics.

10. The system of claim 9, further comprising a battery database communicatively coupled to the one or more hardware processors, wherein the one or more hardware processors are further configured by machine-readable instructions to store the data and the predictive model in the battery database for subsequent access by the machine learning server.

11. The system of claim 9, wherein the one or more hardware processors are further configured by machine-readable instructions to categorize each of the plurality of cells.

12. The system of claim 11, wherein categorizing each of the plurality of cells comprises binning each of the plurality of cells based on one or more of a cell size, a cell impedance, a cell quality, and a cell performance.

13. The system of claim 9, further comprising a manufacturing computer communicatively coupled to the one or more hardware processors, wherein directing the arrangement of the plurality of cells comprises transmitting arrangement instructions to the manufacturing computer.

14. The system of claim 9, wherein the arrangement of the plurality of cells is an optimal arrangement that maximizes a life of the battery pack or maximizes a performance of the battery pack.

15. The system of claim 9, wherein the arrangement of the plurality of cells causes one or more of the following: maximizes a charge capacity of the battery pack, maximizes a discharge capacity of the battery pack, minimizes a charge time of the battery pack, and minimizes a likelihood of a failure of the battery pack.

16. The system of claim 9, wherein the one or more battery testing devices comprise one or more high-throughput (HT) cyclers.

17. A non-transitory computer-readable storage medium having instructions embodied thereon, the instructions being executable by one or more processors to perform a method for arranging a plurality of cells in a vehicle battery pack, the method comprising:
receiving data pertaining to cells installed in each vehicle of a fleet of vehicles, the data received from at least one of each vehicle and one or more battery testing devices;
providing the data to a machine learning server;
directing the machine learning server to generate a predictive model based on machine learning of the data;
estimating one or more electrical characteristics of each of the plurality of cells to be included in the vehicle battery pack during manufacture thereof based on the predictive model; and
directing an arrangement of the plurality of cells within the battery pack during manufacture based on the one or more electrical characteristics.

18. The computer-readable storage medium of claim 17, wherein the method further comprises storing the data and the predictive model in a battery database for subsequent access by the machine learning server.

19. The computer-readable storage medium of claim 17, wherein the method further comprises categorizing each of the plurality of cells.

20. The computer-readable storage medium of claim 17, wherein directing the arrangement of the plurality of cells comprises transmitting arrangement instructions to a manufacturing computer.

\* \* \* \* \*

UNITED STATES PATENT AND TRADEMARK OFFICE
CERTIFICATE OF CORRECTION

PATENT NO.          : 11,084,387 B2
APPLICATION NO.     : 16/284483
DATED               : August 10, 2021
INVENTOR(S)         : Patrick K. Herring, Muratahan Aykol and Abraham Anapolsky It is certified that error appears in the above-identified patent and that said Letters Patent is hereby corrected as shown below:

On the Title Page

In page 2, Column 1, item (56), U.S. patent documents, cite no. 2, delete "Horrell" and insert --Horrell et al.--, therefor.

In page 2, Column 2, item (56), U.S. patent documents, cite no. 2, delete "Barfield, Jr." and insert --Barfield, Jr. et al.--, therefor.

In page 2, Column 2, item (56), U.S. patent documents, cite no. 3, delete "Nicholas" and insert --Nicholas et al.--, therefor.

In page 2, Column 2, item (56), U.S. patent documents, cite no. 5, delete "McElhinney" and insert --McElhinney et al.--, therefor.

In page 2, Column 2, item (56), U.S. patent documents, cite no. 6, delete "Karner" and insert --Karner et al.--, therefor.

In page 2, Column 2, item (56), U.S. patent documents, cite no. 9, delete "Barfield, Jr." and insert --Barfield, Jr. et al.--, therefor.

In page 2, Column 2, item (56), U.S. patent documents, cite no. 10, delete "Fleischer" and insert --Fleischer et al.--, therefor.

In page 2, Column 2, item (56), U.S. patent documents, cite no. 11, delete "Ferguson" and insert --Ferguson et al.--, therefor.

In page 2, Column 2, item (56), U.S. patent documents, cite no. 12, delete "Grimes" and insert --Grimes et al.--, therefor.

In page 2, Column 2, item (56), U.S. patent documents, cite no. 13, delete "Kumar" and Signed and Sealed this
Fifth Day of October, 2021

Drew Hirshfeld
*Performing the Functions and Duties of the
Under Secretary of Commerce for Intellectual Property and
Director of the United States Patent and Trademark Office* insert --Kumar et al.--, therefor.

In page 2, Column 2, item (56), U.S. patent documents, cite no. 15, delete "Aykol" and insert --Aykol et al.--, therefor.

In page 2, Column 2, item (56), U.S. patent documents, cite no. 16, delete "Aykol" and insert --Aykol et al.--, therefor.

In page 2, Column 2, item (56), U.S. patent documents, cite no. 17, delete "Herring" and insert --Herring et al.--, therefor.

In the Specification

In Column 6, Line(s) 52, before "battery", delete "an" and insert --a--, therefor.